United States Patent [19]

Nakagawa et al.

[11] Patent Number: 4,785,340
[45] Date of Patent: Nov. 15, 1988

[54] SEMICONDUCTOR DEVICE HAVING DOPING MULTILAYER STRUCTURE

[75] Inventors: Kiyokazu Nakagawa, Amsterdam-Oost, Netherlands; Akitoshi Ishizaka, Kokubunji, Japan; Yasuhiro Shiraki, Hino, Japan; Yoshimasa Murayama, Koganei, Japan

[73] Assignee: Director-General of the Agency of Industrial Science and Technology, Tokyo, Japan

[21] Appl. No.: 839,349

[22] Filed: Mar. 13, 1986

[30] Foreign Application Priority Data

Mar. 29, 1985 [JP] Japan .................... 60-63430
Mar. 29, 1985 [JP] Japan .................... 60-63431

[51] Int. Cl.⁴ .................... H01L 29/72; H01L 27/12; H01L 29/161
[52] U.S. Cl. .................... 357/35; 357/4; 357/16; 357/34; 357/58
[58] Field of Search .................... 357/4 SL, 4, 58, 35, 357/34, 16, 34 HB

[56] References Cited

U.S. PATENT DOCUMENTS

| | | | |
|---|---|---|---|
| 4,163,237 | 7/1979 | Dingle et al. | 357/22 A |
| 4,378,629 | 4/1983 | Bozler et al. | 357/15 |
| 4,514,747 | 4/1985 | Miyata et al. | 359/90 |
| 4,667,211 | 5/1987 | Iafrate et al. | 357/58 |

FOREIGN PATENT DOCUMENTS 58-142574  8/1983  Japan .................... 357/4 SL

OTHER PUBLICATIONS

Kroemer, "Heterostructure Bipolar Transistors: What Should We Build?", pp. 126–130, J. Vac. Sci. Technol. B1 (2), Apr.–Jun. 1983.
Bozler et al, "Fabrication and Numerical Simulation of the Permeable Base Transistor", pp. 1128–1141, IEEE Transactions on Electron Devices, vol. ED-27, No. 6, Jun. 1980.
Ploog et al, "Compositional and Doping Superlattices in III-V Semiconductors", pp. 285–359, Advances in Physics, 1983, vol. 32, No. 3.
Döhler, "Ultrathin Doping Layers as a Model for ED Systems", Surface Science, pp. 97 to 105, vol. 73, 1978.
Döhler, "Doping Superlattices", J. Vac. Sci. Technol., 1C (3), May/Jun. 1979, pp. 851 to 856.
Döhler, "Solid-State Superlattices", Scientific American, Nov. 1983, pp. 144 to 151.

*Primary Examiner*—J. Carroll
*Assistant Examiner*—Ngân Van Ngô
*Attorney, Agent, or Firm*—Antonelli, Terry & Wands

[57] ABSTRACT

A semiconductor device includes a multilayer semiconductor structure comprising alternately p- (or n-) type heavily doped semiconductor layers and n- (or p-) type lightly doped semiconductor layers. Holes (or electrons) are confined within a narrow layer in a fashion like a two-dimensional gas, whereby high mobility is realized notwithstanding of high carrier concentration. Electrical conductivity of the multilayer semiconductor structure can be made higher than that of a bulk semiconductor. Very high conductivity can be realized by forming each layer in a thickness within a range of 10 Å to 1000 Å and preferably 50 Å to 500 Å. Ratio in impurity concentration of the heavily doped layer to the low doped layer is not smaller than one order of magnitude.

6 Claims, 7 Drawing Sheets

SEMICONDUCTOR DEVICE HAVING DOPING MULTILAYER STRUCTURE

BACKGROUND OF THE INVENTION

1. Field of the Invention

The present invention relates to a doped multi-layer structure composed of a number of doped semiconductor thin layers stacked one on another. More particularly, the invention concerns a semiconductor device having a doping multilayer structure, i.e. multilayer structure formed by different doping.

2. Description of the Prior Art

A high electric conductivity of a semiconductor device implies that the device is excellent in high-speed operation and low power consumption. The electric conductivity is in proportion to the mobility of carriers and more specifically to the effective mobility of carriers in a current path. The effective mobility is usually lower than the bulk mobility of semiconductor which constitutes the current path, due to various scattering mechanisms. The bulk mobility, however, provides a reasonable measure for the effective mobility. Accordingly, it has been considered important for attaining a high-speed operation of a semiconductor device to realize it with a semiconductor material having a high bulk mobility. An example is a GaAs device in comparison to the Si device.

Further, there has been reported an attempt for modulating an electric signal or optical signal by applying an external electric field to a semiconductor multilayer structure including a doping superlattice, in the direction perpendicular to the structure and thereby varying the effective forbidden band gap of the doping superlattice. Reference may be made, for example, to K. Ploog and G. H. Dohler's article "Compositional and Doping Superlattices in III-V Semiconductors" appeared in "Advanced Physics" Vol. 32, No. 3 (1983), p.p. 285-359. In this literature, an nipi-doping multilayer structure in which doping concentration of both n- and p-type impurities is approximately on the order of $1 \times 10^{18}$ cm$^{-3}$, $n \approx p \approx 1 \times 10^{18}$/cm$^3$, is discussed. In this structure, electrons are present in n-type layers, while holes are present in p-type layers. As a whole, both electrons and holes exist concurrently within the multilayer structure. This sort of structure is unlikely to promise the possibility of increasing the mobility.

SUMMARY OF THE INVENTION

An object of the present invention is to provide a semiconductor multilayer structure capable of exhibiting a high mobility.

It is another object of the invention to provide a semiconductor device incorporating a semiconductor multilayer structure having a high carrier mobility.

In view of the above and other objects which will be more apparent as description proceeds, there is provided according to an aspect of the present invention a semiconductor multilayer structure composed of a stack of impurity doped layers and characterized by the features mentioned below:

(a) P-type highly (heavily) doped semiconductor layers (11) and n-type lightly or low doped semiconductor layers (12) are alternately stacked on one another at least in a number of layers not smaller than three as shown in FIG. 1A of the accompanying drawings (conductivity is of p-type or alternatively n-type highly doped semiconductor layers (13) and p-type lightly or low doped semiconductor layers (14) are alternately stacked at least in a number of layers not smaller than three as shown in FIG. 1B (conductivity is of n-type).

(b) Layer thickness of each of the p-type and n-type semiconductor layers is selected to be in a range of 10 Å to 1000 Å. More preferably, the layer thickness should be within a range of 50 Å to 500 Å.

(c) Ratio of impurity concentration of the highly doped layer to that of the low doped layer should not be smaller than one order of magnitude (concentration ratio being not smaller than 10) and preferably not smaller than two orders of magnitude (ratio not smaller than 100). For purpose of description, the highly doped layer is assumed to have impurity concentration not lower than $10^{16}$ cm$^{-3}$. Although the upper limit of the impurity concentration can not be definitely determined, it is believed that the impurity concentration on the order of $10^{19}$ cm$^{-3}$ will define the usual upper limit.

(d) With the structure according to the invention, a sufficiently high carrier mobility can be realized by using the same semiconductor material for each of the semiconductor layers mentioned above.

The multilayer structures of the impurity doped layers described above exhibit energy band patterns as shown in FIG. 2A or 2B. More specifically, the multilayer structure shown in FIG. 1A exhibits the energy band pattern illustrated in FIG. 2A, while the band diagram of the multilayer structure shown in FIG. 1B is illustrated in FIG. 2B. In FIGS. 2A and 2B, the abscissa represents the depth in the direction in which the layers are stacked, and the ordinate represents the energy level. In the figures, a reference numeral 1 denotes a bottom boundary of conduction band, and 2 denotes a top boundary of valence band. A numeral 15 denotes holes and 16 denotes electrons. As will be seen in these figures, holes (15) are confined within the p-type semiconductor layer (11) in the case of the structure shown in FIG. 1A, while electrons (16) are confined within the n-type semiconductor layer (13) in the case of the structure shown in FIG. 1B, whereby a so-called two-dimensional carrier gas is formed. Consequently, the carriers move within and along the low doped layers scarce of impurity scattering. As a result, when viewed as a whole, a high mobility and hence high electric conductivity can be accomplished notwithstanding high impurity concentration.

It should be mentioned that a semiconductor layer unintentionally doped or undoped may be interposed between the semiconductor layers of opposite conduction types. Thickness of the interposed semiconductor layer should preferably be in a range of 50 Å to 100 Å. Of course, the interposed semiconductor layer is of the same semiconductor material as that of the stacked layers mentioned above.

In the following description, it is assumed that the semiconductor material is silicon (Si). It should however be appreciated that other semiconductor material may be employed to the similar effect.

DESCRIPTION OF THE PREFERRED EMBODIMENT

Example 1

Figure 1A:
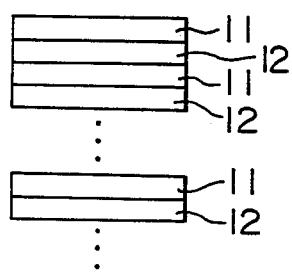
FIGS. 1A and 1B are sectional views showing multilayer semiconductor structures, respectively.
Figure 1B:
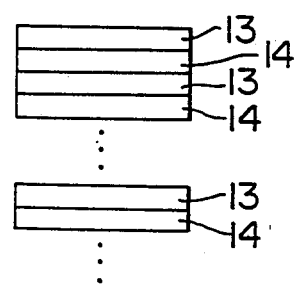
Figure 2A:
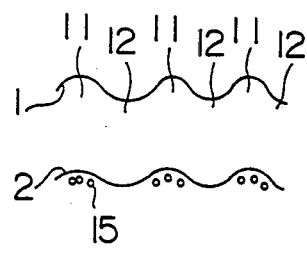
FIGS. 2A and 2B are views illustrating band structures.
Figure 2B:
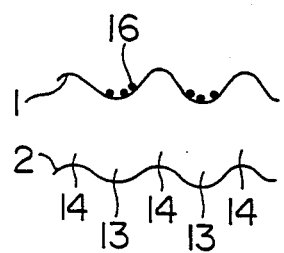
Figure 3A:
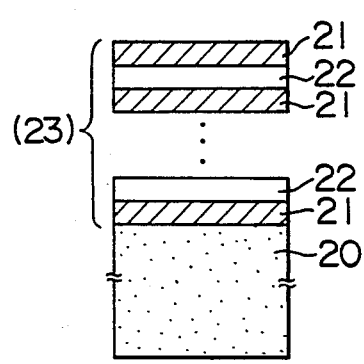
FIGS. 3A, 3B, 3C and 3D, and 5A, 5B, 5C and 5D are views for illustrating methods of manufacturing semiconductor devices incorporating multilayer semiconductor structures according to exemplary embodiments of the invention, respectively.
Figure 3B:
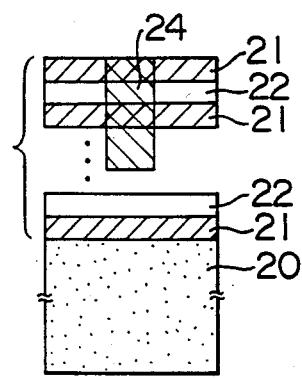
Figure 3C:
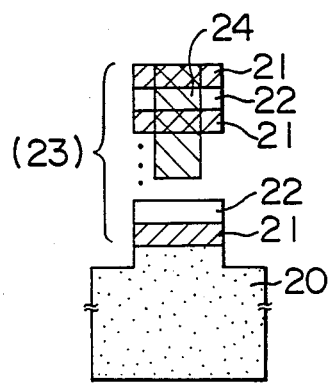

Referring to FIGS. 3A to 3C, a p-type Si-layer 21 containing Ga at a concentration of $1 \times 10^{\sim} cm^{-3}$ was grown to a thickness of 300 Å on a Si-substrate 20 maintained at a temperature of 700° C. by resorting to the technique of molecular beam epitaxy (MBE). Further, an n-type Si-layer 22 containing Sb at a concentration of $1 \times 10^{16} cm^{31\ 3}$ was grown to a thickness of 300 521 on the p-type Si-layer 21. These steps were alternately carried out to realize a doping multilayer structure 23 including twenty layers (FIG. 3A).

Figure 3D:
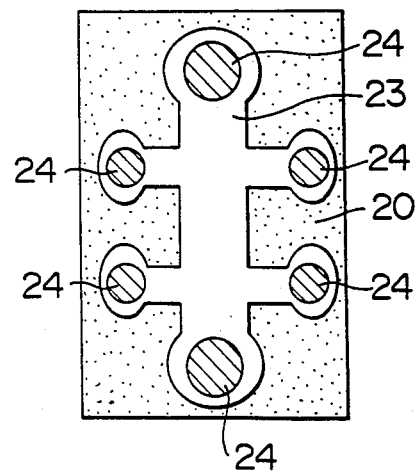

A selected portion or region of the doping multilayer structure was masked with an insulation film in accordance with a well known method, and p-type electrode contact portions 24 were formed through ion implantation of boron (B) at 10 KeV to a dose of $1 \times 10^{15} cm^{-2}$, which was then followed by formation of an Al-electrode on the contact portion 24 (3B). Subsequently, the multilayer structure was dry-etched with $CF_4$ to a geometrical configuration shown in FIG. 3C to obtain a specimen for evaluation of electrical characteristics. FIG. 3D is a top plan view of the structure shown in FIG. 3C.

Figure 4:
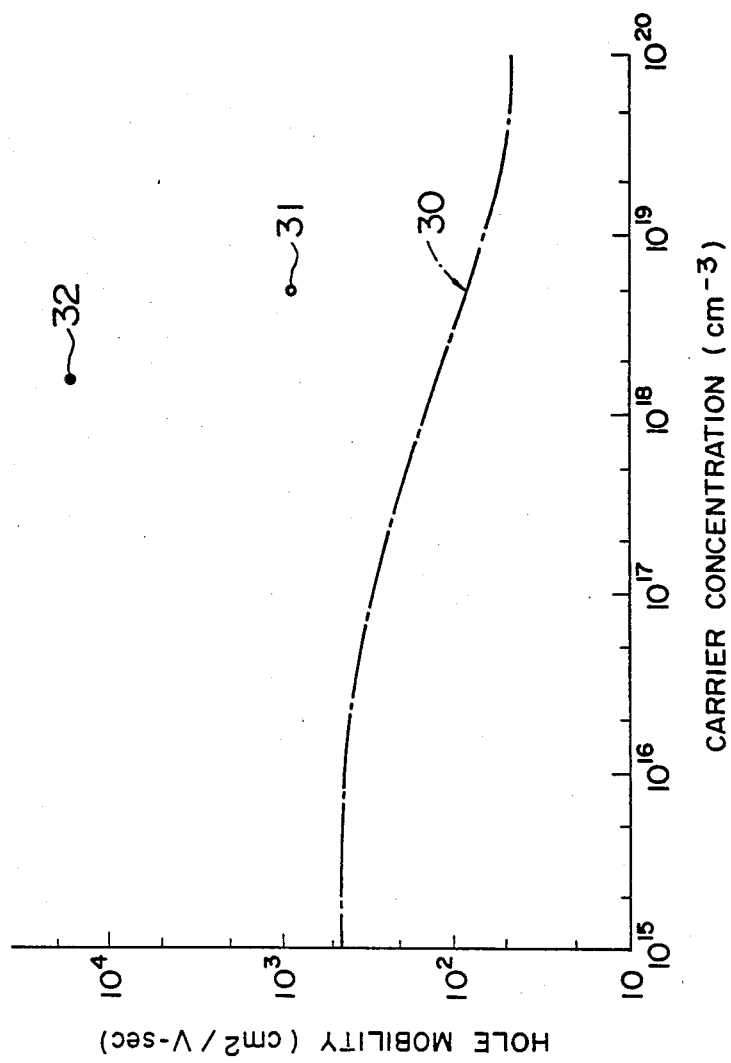
FIG. 4 is a view for illustrating relationship between mobility and carrier concentration as established on the basis of measurement of holes in the device manufactured through the process shown in FIGS. 3A, 3B, 3C and 3D.

The specimen thus prepared was measured in respect to the hole mobility and carrier concentration at a room temperature and at 77° K. respectively. The results of the measurements are shown in FIG. 4. As will be seen in the figure, the value of hole mobility (indicated by a small circle 31) of the specimen according to the invention measured at room temperature is about ten times as high as the corresponding level of a curve 30 which represents a relationship between the hole mobility and the carrier concentration in a bulk specimen also measured at room temperature. Moreover, the carrier mobility of $2 \times 10^4 cm^2/V \cdot sec$ is attained at 77° K. as indicated by a solid point 32 notwithstanding of the fact that the carrier concentration is as high as $10^{18} cm^{-3}$. These results of measurement prove the advantageous effect of the semiconductor multilayer structure according to the invention.

Example 2

An increased mobility has been confirmed in the multilayer structure composed of n-type heavily doped semiconductor layers and p-type low doped semiconductor layers stacked alternately with one another.

Figure 5A:
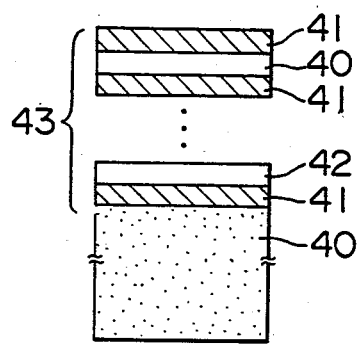
Figure 5B:
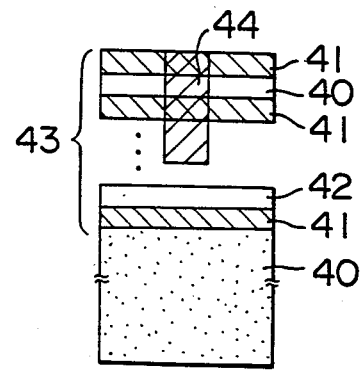
Figure 5C:
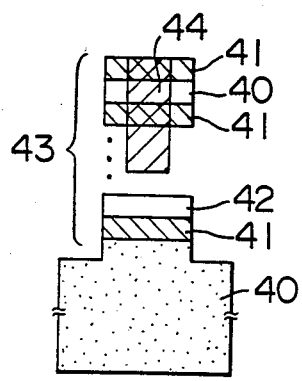
Figure 5D:
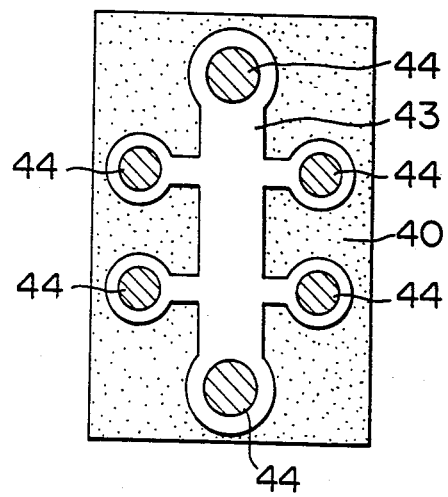

FIGS. 5A to 5C are sectional views for illustrating stepwise a method of manufacturing a multilayer structure through doping according to the instant example. Referring to these figures, an n-type Si-layer 41 containing Sb at a concentration of $5 \times 10^{16} cm^{-3}$ was grown to a thickness of 300 Å on a Si-substrate 40 at a substrate temperature of 700° C. by resorting to the techniques of molecular beam epitaxy (MBE). Further, a p-type Si-layer 42 containing Ga at a concentration of $5 \times 10^{15} cm^{-3}$ was grown to a thickness of 300 Å on the n-type Si-layer 41. These steps were alternately repeated to realize a doping multilayer structure 43 including fifteen layers (FIG. 5A). Subsequently, electrode contact portions 44 were formed through ion implantation of phosphorus ions (P+) at 180 KeV to a dose of $5 \times 10^{14} cm^{-2}$ (FIG. 5B). Subsequently, the multilayer structure was dry-etched with $CF_4$ to the configuration shown in FIG. 5C to be employed as a specimen for electrical evaluation. FIG. 5D is a top plan view of the multilayer structure.

The mobility of the specimen thus prepared was found to be about three times as high as that of the bulk specimen. In other words, the specimen prepared according to the instant example also exhibited an improved carrier mobility as in the case of the preceding example.

As will be appreciated from the foregoing description, the doping multilayer structure according to the invention can assure at least twice as high carrier mobility as the bulk structure and is of great use for a semiconductor device exhibiting a high carrier mobility.

Figure 6:
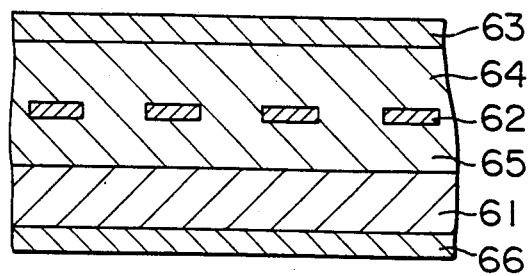
FIG. 6 is a sectional view of a permeable base transistor.

In this conjunction, it is noted that a permeable base transistor having a comb-like metal layer buried in a semiconductor layer as shown in FIG. 6 has been proposed and fabricated for trial (see C. O. Bozler and G. D. Ally: IEEE Trans. Electron Devices, ED-27, p. 1128, 1980). In FIG. 6, a reference numeral 65 denotes a base region, 61 denotes a collector region, 62 denotes a metal base, 63 denotes an emitter region, and 66 denotes a metallized electrode layer. This type of transistor is characterized by an extremely short transit length of carriers and can be advantageously employed for attaining a high-speed operation. However, in view of the fact that non-uniformity in the line width of the buried metal layer 62 exerts significant influence to the operating voltage of the transistor, there arises a problem that difficulty is encountered in conjunction with the control of the threshold value. To solve the problem, it has been proposed by Kroemer to make use of the metal layer as a buried wiring for the base of a bipolar transistor instead of the control electrode (see H. Kroemer; J. Vac. Sci. Technol. BI p. 126, 1983). In the case of the bipolar transistor, the threshold voltage is determined in dependence on the built-in potential across the pn-junction and scarcely subjected to the influence of non-uniformity or variation in the width of wiring line. Since the resistance of the metal layer is low as compared with that of semiconductor material, the base resistance can be held at a low value even when the base width is decreased, rendering it possible to attain a high-speed operation. However, at the present state of technology, actual implementation of this kind of element is not known except for the permeable base transistor. In reality, the concept proposed by Kroemer has not been realized yet. As an approach to this problem, a combination of silicon and silicide has been proposed. However, since heteroexpitaxial growth of semiconductor and metal is necessarily adopted, strict control is required on the manufacturing conditions. Further, restriction is imposed on the temperature and other factors. For facilitating the fabrication, a semiconductor material having a high conductivity should preferably be used instead of metal. However, in practice, semiconductor material having the desired conductivity is unavailable.

It has been found surprisingly that higher conductivity than that of the bulk crystal can be realized with the doping multilayer structure according to the invention: i.e. a so-called doping superlattice structure is formed in which impurities are doped in a super-crystallattice fashion, impurity concentration in one of n-type or p-type layer is higher than that of the other by a factor of 10 or more, and the layer thickness is in a range of 10 to 1000 Å. In other words, by using the doping multilayer structure according to the invention as the material for the base electrode, a novel ultra-high speed element can be implemented. In other words, there is proposed according to another aspect of the invention a novel transistor structure in which a semiconductor multilayer structure composed of a predetermined number of doped layers is buried in contact with a base region as a layer of high conductivity to thereby implement the transistor whose base resistance is significantly reduced and which thus can enjoy excellent high-speed performances. In the following, an exemplary embodiment of the transistor according to the invention will be described in detail by referring to FIGS. 7A to 7G.

Example 3

Figure 7A:
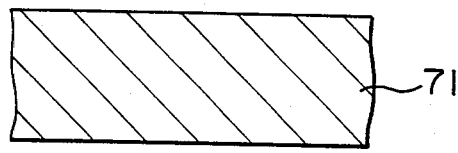
FIGS. 7A, 7B, 7C, 7D, 7E, 7F and 7G are sectional views showing a series of steps involved in manufacturing the semiconductor device according to another embodiment of the invention as well as a completed structure thereof.

A chemically cleaned Si substrate 71 of (100) surface orientation was introduced into a molecular beam epitaxy system (MBE system) and heat-treated under ultra-high vacuum for preparing a clean surface of the Si-substrate (FIG. 7A). The MBE system is a sort of evaporation system or evaporator having a base pressure of less than $10^{-9}$ Torr and in which a plurality of independent effusion cells of molecular beams and/or atomic beams are installed as effusion sources. The MBE system employed in the instant example has a base pressure of $5 \times 10^{-11}$ Torr and includes separate effusion cells for molecular beams of Si, Ga and Si, respectively, as the effusion sources.

The temperature of the Si-surface having the surface cleaned was set at 700° C. From the time point when the temperature became constant, growth of a Si-layer 72 on the substrate 71 was started. Concurrently, Sb was fed from the associated molecular beam cell for imparting n-type conduction. Of cource, P or As or impurity ions may be used in place of Sb. Concentration of the n-type dopant in this layer was on the order of $10^{18}$ cm$^{-3}$. When the layer thickness reached 1 μm, temperature of the Sb-molecular beam source was lowered, and the n-type layer having a concentration of $10^{16}$ cm$^{-3}$ and a width of 0.3 μm was grown. Then, the shutter of the Sb-molecular beam source was closed while the shutter for the Ga-molecular beam source or cell was opened to cause a p-type layer 73 to grow, which layer is to serve as the base region. It should be mentioned that Ga-beam may be replaced by B-molecular beam or ion beam. Concentration of the p-type layer 73 was on the order of $10^{18}$ cm$^{-3}$. After the growth of the layer 73 to a thickness of 0.2 μm, the shutter for the Ga-molecular beam source was closed.

Figure 7B:
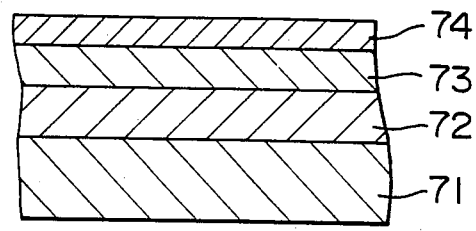
Figure 7C:
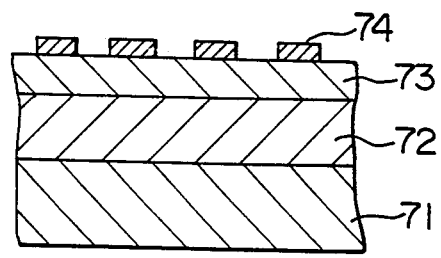
Figure 7D:
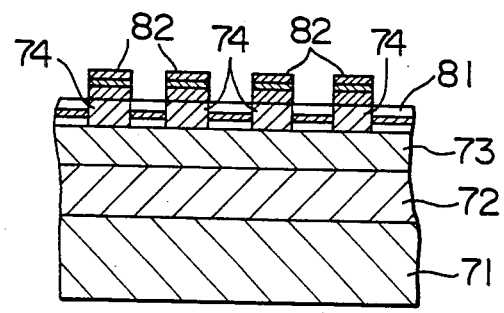
Figure 7E:
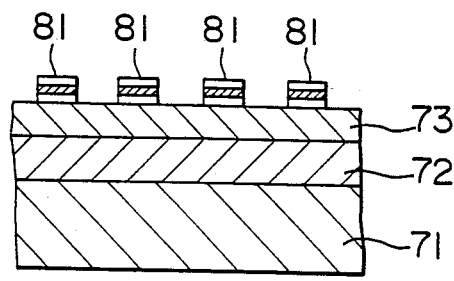

Next, the specimen was taken out from the MBE system and a SiO$_2$-film 74 was formed in a thickness of about 2300 Å through thermal oxidation process (FIG. 7B). Subsequently, the SiO$_2$-layer 74 was formed into a comb-like pattern through conventional photolithography technique (FIG. 7C). When the region of the SiO$_2$-layer to be removed should not exceed 0.4 μm, an electron beam lithography may be employed. After the SiO$_2$-layer of comb-like pattern 74 was formed, the specimen was cleaned to be subsequently introduced into the MBE system. After having been thermally cleaned at 800° C., a p-type layer containing Ga at a concentration of $1 \times 10^{18}$ cm$^{-3}$ was allowed to grow to a thickness of 300 Å at a substrate temperature of 700° C. Further, an n-type layer containing Sb at a concentration of $1 \times 10^{16}$ cm$^{-3}$ was grown on the p-type layer to a thickness of 300 Å. This process was repeated five times to form semiconductor multilayer structures 81 and 82, as shown in FIG. 7D. In the semiconductor multilayer structure thus prepared, each layer exhibits a statistical impurity profile or distribution retained to an extent brought about by thermal diffusion which in turn is determined by the temperature for growth, owing to the molecular beam epitaxy process. The multilayer structure thus prepared was again taken out of the MBE system to etch off the SiO$_2$-layer 74 and the polysilicon multilayer film 82 deposited thereon to thereby leave a Si-epitxay layer 81 of the doping multilayer structure in a comb-like pattern (FIG. 7E). The specimen was cleaned and again placed in the MBE system. After thermal cleaning, a p-type semiconductor layer 75 having an impurity concentration of $10^{18}$ cm$^{-3}$ was grown to a thickness of ca. 100 Å at the substrate temperature of ca. 650° C. This p-type semiconductor layer 75 is not necessarily required. However, this layer 75 serves to provide an effective barrier between an n-type semiconductor layer 76 deposited thereon and the semiconductor multilayer structure.

Figure 7F:
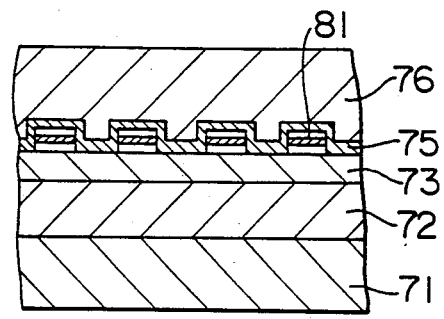
Figure 7G:
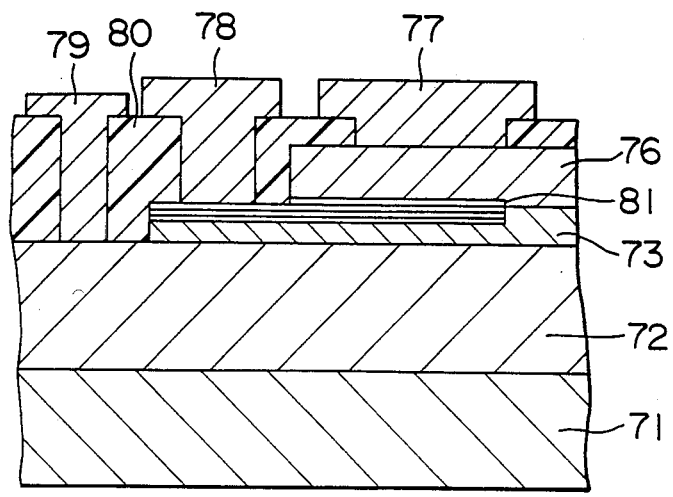

Next, impurity or dopant Ga was exchanged to Sb to form an n-type semiconductor layer 76 in a thickness of 0.2 μm which is destined to serve as an emitter region (FIG. 7F). The impurity concentration of this layer 76 was $5 \times 10^{19}$ cm$^{-3}$. The semiconductor specimen thus prepared was taken out of the MBE system, being followed by element isolation, formatio of electrodes and realization of the element through the processes similar to those adopted conventionally in the fabrication of a bipolar transistor. FIG. 7G shows a section taken along the direction perpendicular to those shown in FIGS. 7A to 7F. In FIG. 7G, a numeral 80 denotes an insulation layer, 77 denotes an emitter electrode, 78 denotes a base electrode, and 79 denotes a collector electrode. It will be seen that the base electrode 78 is provided in contact with a semiconductor multilayer structure.

In the completed bipolar transistor which is of the identical structure as that of the hitherto known one except for the doping multilayer structure, the base resistance is reduced to about ⅓ while the cut-off frequency is increased by a factor of 1.5, which means an improvement on the high-speed performance over the conventional bipolar transistor.

It should be understood that the comb-like electrode configuration is not essential to the invention. Any other electrode configuration may be adopted so far as openings are present.

As will be appreciated from the foregoing description, an increase in the base resistance of the silicon bipolar transistor can be positively prevented according to the invention, which would otherwise be involved due to the reduction in thickness of the base layer, whereby the transistor characteristics and particularly high-speed performance is improved by a factor around 2.

We claim:

1. A bipolar transistor comprising:

a semiconductor substrate;

an emitter layer of a first conductivity type, a base layer of a second conductivity type, opposite to said first conductivity type, and a collector layer of said first conductivity type, formed on said substrate;

an emitter electrode, a base electrode, and a collector electrode for electrically connecting to said emitter layer, said base layer and said collector layer, respectively;

a doping multilayer structure placed in contact with said base layer and with said base electrode for electrically interconnecting said base electrode and said base layer;

wherein said doping multilayer structure has an opening through which said emitter layer is connected with said base layer, and wherein said doping multilayer structure comprises first semiconductor layers doped heavily with impurity of said second conductivity type, and second semiconductor layers formed of a same semiconductor material as that of said first semiconductor layers and doped lightly with impurity of said first conductivity type, said first and second semiconductor layers being alternately stacked, the ratio of impurity concentration in said first semiconductor layers to that in said second semiconductor layers being at least ten, and each of said first and second semiconductor layers having a thickness in a range from 10 Å to 1000 Å.

2. A bipolar transistor according to claim 1, wherein said opening has a comb like or a lattice like planar pattern.

3. A bipolar transistor according to claim 1, wherein said base layer includes first and second base sub-layers, said doping multilayer structure being disposed between said first and second base sub-layers.

4. A bipolar transistor according to claim 1, wherein the first and the second semiconductor layers in said multilayer structure are formed of silicon.

5. A bipolar transistor according to claim 2, wherein the first and the second semiconductor layers in said multilayer structure are formed of silicon.

6. A bipolar transistor according to claim 3, wherein the first and the second semiconductor layers in said multilayer structure are formed of silicon.

* * * * *